(12) United States Patent
Gioulekas et al.

(10) Patent No.: US 9,252,811 B2
(45) Date of Patent: Feb. 2, 2016

(54) TIME-VARYING LOW-DENSITY PARITY-CHECK CONVOLUTIONAL CODES

(75) Inventors: Fotios Gioulekas, Palamas (GR); Constantinos Petrou, Athens (GR); Michael Birbas, Patras (GR)

(73) Assignee: ANALOGIES SA, Patras (GR)

( * ) Notice: Subject to any disclaimer, the term of this patent is extended or adjusted under 35 U.S.C. 154(b) by 516 days.

(21) Appl. No.: 13/490,940

(22) Filed: Jun. 7, 2012

(65) Prior Publication Data

US 2013/0061117 A1    Mar. 7, 2013

Related U.S. Application Data

(60) Provisional application No. 61/494,006, filed on Jun. 7, 2011.

(51) Int. Cl.
*H03M 13/13* (2006.01)
*H03M 13/11* (2006.01)
*H03M 13/03* (2006.01)

(52) U.S. Cl.
CPC ........ *H03M 13/1154* (2013.01); *H03M 13/036* (2013.01); *H03M 13/1171* (2013.01)

(58) Field of Classification Search
CPC ............ H03M 13/1154; H03M 13/23; H03M 13/1171; H03M 13/616; G06F 11/10
USPC .......... 714/785, E11.032, 702, 799, 786, 755, 714/801, 781
See application file for complete search history.

(56) References Cited

U.S. PATENT DOCUMENTS

| | | | |
|---|---|---|---|
| 8,271,851 B2* | 9/2012 | Dore et al. | 714/758 |
| 8,732,545 B2* | 5/2014 | Murakami | 714/758 |

* cited by examiner

*Primary Examiner* — Phung M Chung
(74) *Attorney, Agent, or Firm* — Franco S. De Liguori

(57) ABSTRACT

The present disclosure is directed to communication systems and more specifically to communication devices having encoder and/or decoder blocks employing Low Density Parity Check Convolutional Codes (LDPC CCs). According to exemplary embodiments, improved LDPC CC techniques are disclosed to construct the syndrome former of an LDPC-CC code in a systematic way based on desired Rate (b/c), Memory ($m_s$) and Period (T) while achieving specific Degree Distribution (dv and dc), Girth, and ACE constraints ($n_{ACE}$, $d_{ACE}$) for a desired configuration.

9 Claims, 20 Drawing Sheets

$$H_i^T(t) = \begin{pmatrix} h_i^{(1,1)}(t) & \cdots & h_i^{(1,c-b)}(t) \\ \vdots & & \vdots \\ h_i^{(c,1)}(t) & \cdots & h_i^{(c,c-b)}(t) \end{pmatrix} \qquad h_i^{(n,m)}(t) \in GF(2^v)$$

$$\beta_i \in GF(2^v) \setminus \{0\}$$

US 9,252,811 B2

TIME-VARYING LOW-DENSITY PARITY-CHECK CONVOLUTIONAL CODES

RELATED APPLICATIONS

This application claims the benefit of U.S. Provisional Application No. 61/494,006, filed on Jun. 7, 2011, commonly owned and assigned to the same assignee hereof.

TECHNICAL FIELD

The present disclosure is directed to communication systems and more specifically to communication devices having encoder and/or decoder blocks employing Low Density Parity Check Convolutional Codes (LDPC CC).

BACKGROUND

The LDPC CC process utilizes a transposed parity check matrix (also called "syndrome former") $H^T$. This matrix is characterized by sub-matrices $H_i^T(t)$, each of size c×(c−b), where b/c is the desired rate of the code, b is equal to the number of information bits per encoding time instance and c is equal to the number of code bits per encoding time instance.

Typically, a transposed parity check matrix in LDPC-CCs is semi-infinite. Due to the special characteristics of LDPC-CC transposed parity check matrices, their semi-infinite nature and structure, periodically changing matrices are used in practice.

The same non-zero elements in the matrix, called connections, are repeated after a period T, and therefore only T time instances are needed to fully describe an LDPC-CC matrix. In these T time instances all different variable node connections and check node connections are present.

The largest i such that $H_i^T(t+i)$ is a non-zero matrix for some t is called the syndrome former Memory $m_s$. Each group of c consecutive rows of the syndrome former corresponds to a time instance and is called a "phase".

Conventional LDPC CC techniques do not provide a systematic way to construct the syndrome former based on desired Rate (b/c), Memory ($m_s$) and Period (T) while achieving specific Degree Distribution ($d_v$ and $d_c$), Girth, and Approximate Cycle Extrinsic Message Degree (AC EMD or ACE) constraints ($n_{ACE}$, $d_{ACE}$) for a desired configuration.

It is desirable for encoders and decoders employed in communication systems and devices and which rely on LDPC CCs to be configurable with a broader range of adjustable parameters than previously possible.

SUMMARY

The present disclosure is directed to communication systems and/or communication devices, and associated methods of operation thereof, which employ encoder and/or decoder blocks based on Low Density Parity Check Convolutional Codes (LDPC CCs).

In accordance with exemplary embodiments, there are described improved techniques, together with associated logic blocks, to construct the syndrome former of an LDPC-CC code in a systematic way based on desired Rate (b/c), Memory ($m_s$) and Period (T) while achieving specific Degree Distribution (dv and dc), Girth, and ACE constraints ($n_{ACE}$, $d_{ACE}$) for a desired configuration.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The present disclosure is directed to techniques for providing a systematic way to construct the syndrome former of an LDPC Convolutional Code (LDPC-CC) based on desired Rate (b/c), Memory ($m_s$) and Period (T) while achieving specific Degree Distribution ($d_v$ and $d_c$), Girth, and ACE constraints ($n_{ACE}$, $d_{ACE}$) for a desired configuration by using permuted c×c unit matrices.

Figure 1:
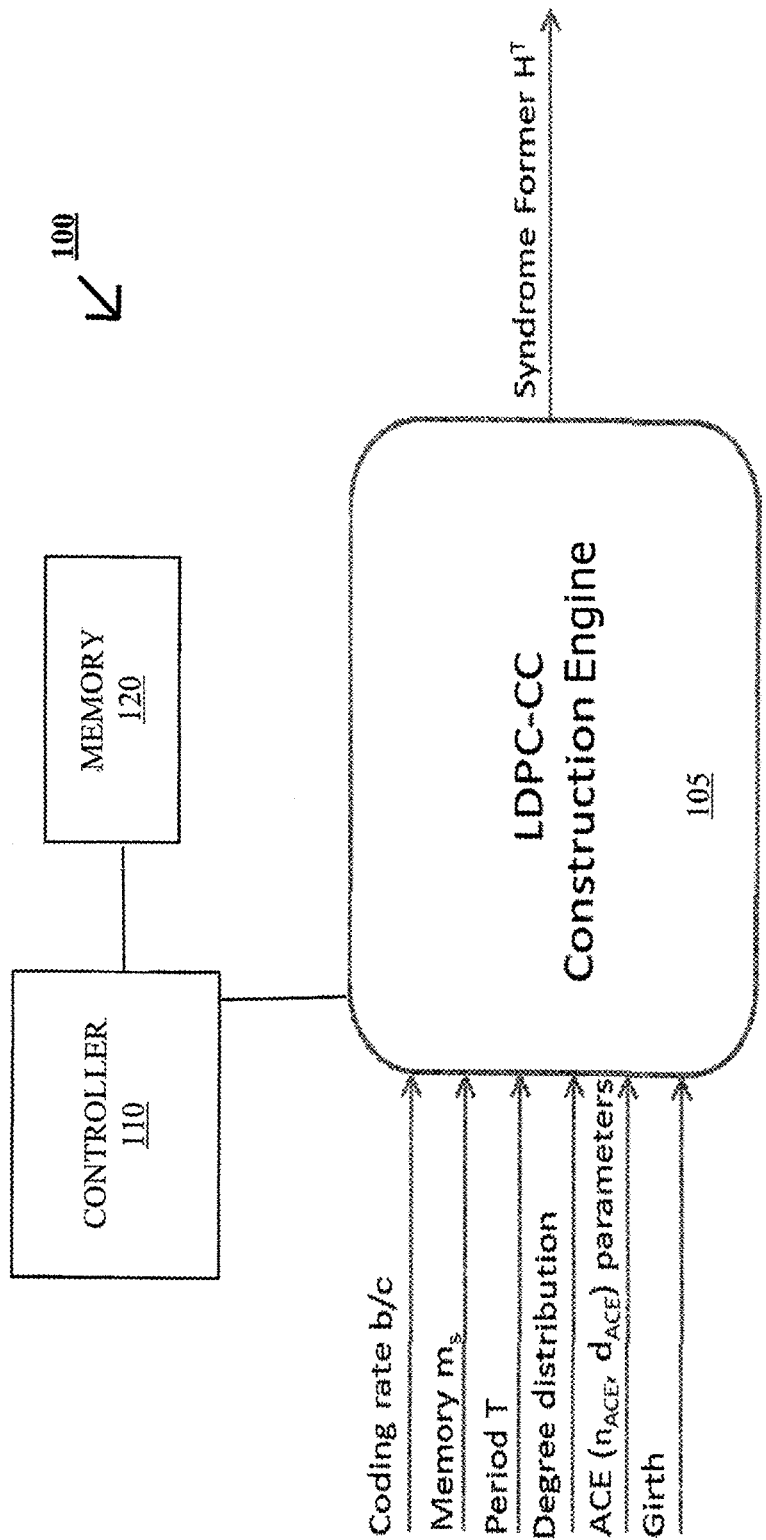
FIG. 1 is a high level functional diagram of a communication system that constructs a syndrome former (SF) $H^T$ in accordance with an exemplary embodiment of the present invention.

FIG. 1 is a high level functional diagram of a communication system 100 that constructs a syndrome former (SF) $H^T$ in accordance with an exemplary embodiment of the present invention.

Communication system 100 comprises LDPC-CC Construction Engine 105 which is driven by controller 110. Memory 120 is coupled thereto to facilitate data storage and retrieval functionality.

LDPC-CC Construction Engine 105 receives and processes, under the control of controller 110, a set of inputs which serve to define parameters associated with desired properties of syndrome former (SF) $H^T$. The inputs include a desired coding rate value (b/c), a desired Memory ($m_s$) value, a desired Period (T) value of the SF, a desired Degree Distribution of the SF, desired ACE ($n_{ACE}$, $d_{ACE}$) constraints of the SF, and a desired minimum acceptable Girth value. As shown, each of the inputs is processed by LDPC-CC Construction Engine to generate the SF $H^T$.

Figure 2:
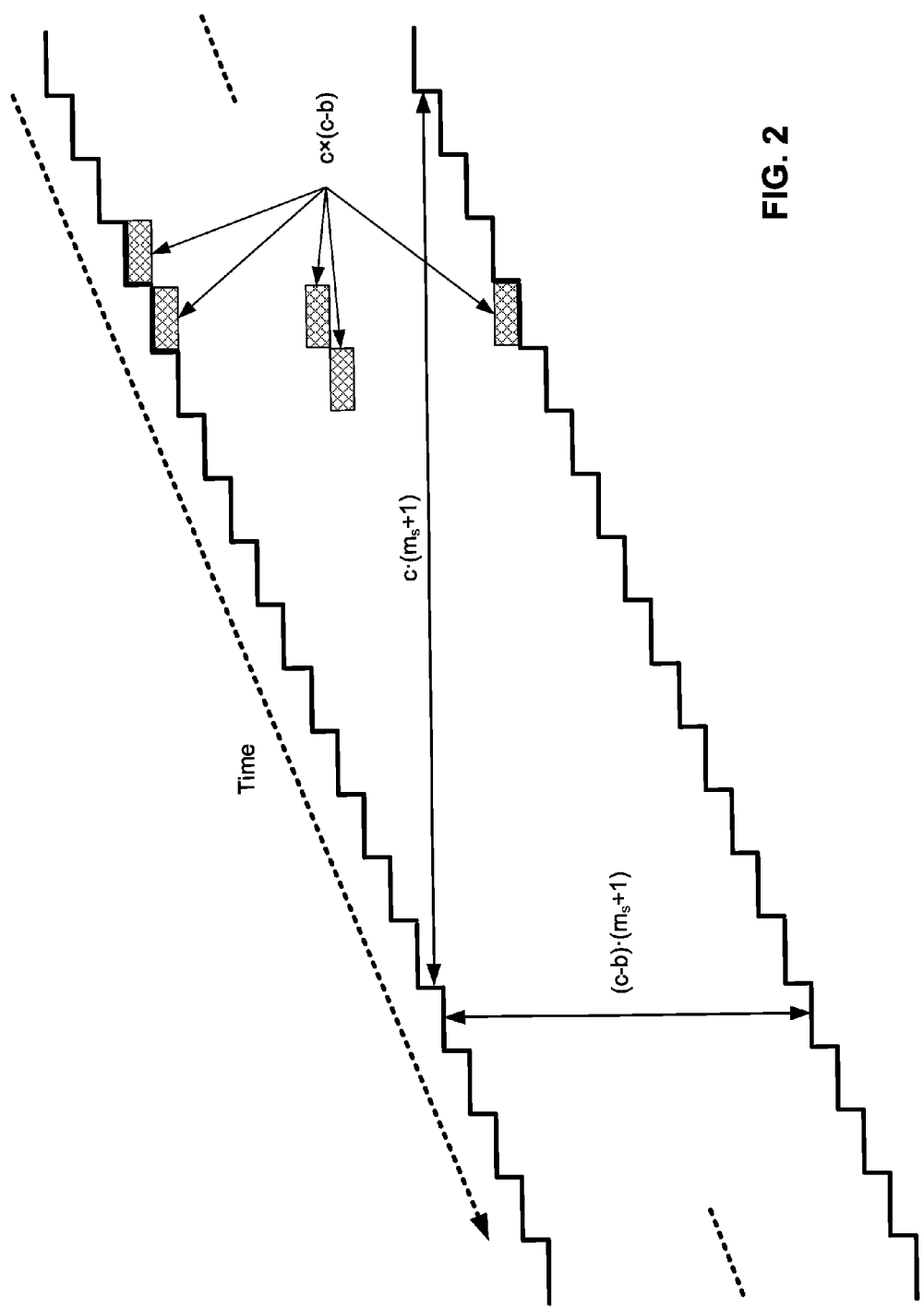
FIG. 2 is a diagram illustrating the conventional, well known structure of a semi-infinite LDPC-CC transposed parity check matrix.

FIG. 2 is a diagram illustrating the conventional, well known structure of a semi-infinite LDPC-CC transposed parity check matrix. The "central diagonal" of the matrix is shown, and its width and height are denoted. The constituting c×(c−b) sub-matrices are also denoted. The width of the central diagonal of the matrix is equal to (c−b)*($m_s$+1). Similarly, the height of the central diagonal of the matrix is represented by and equal to c*($m_s$+1).

Figure 3:
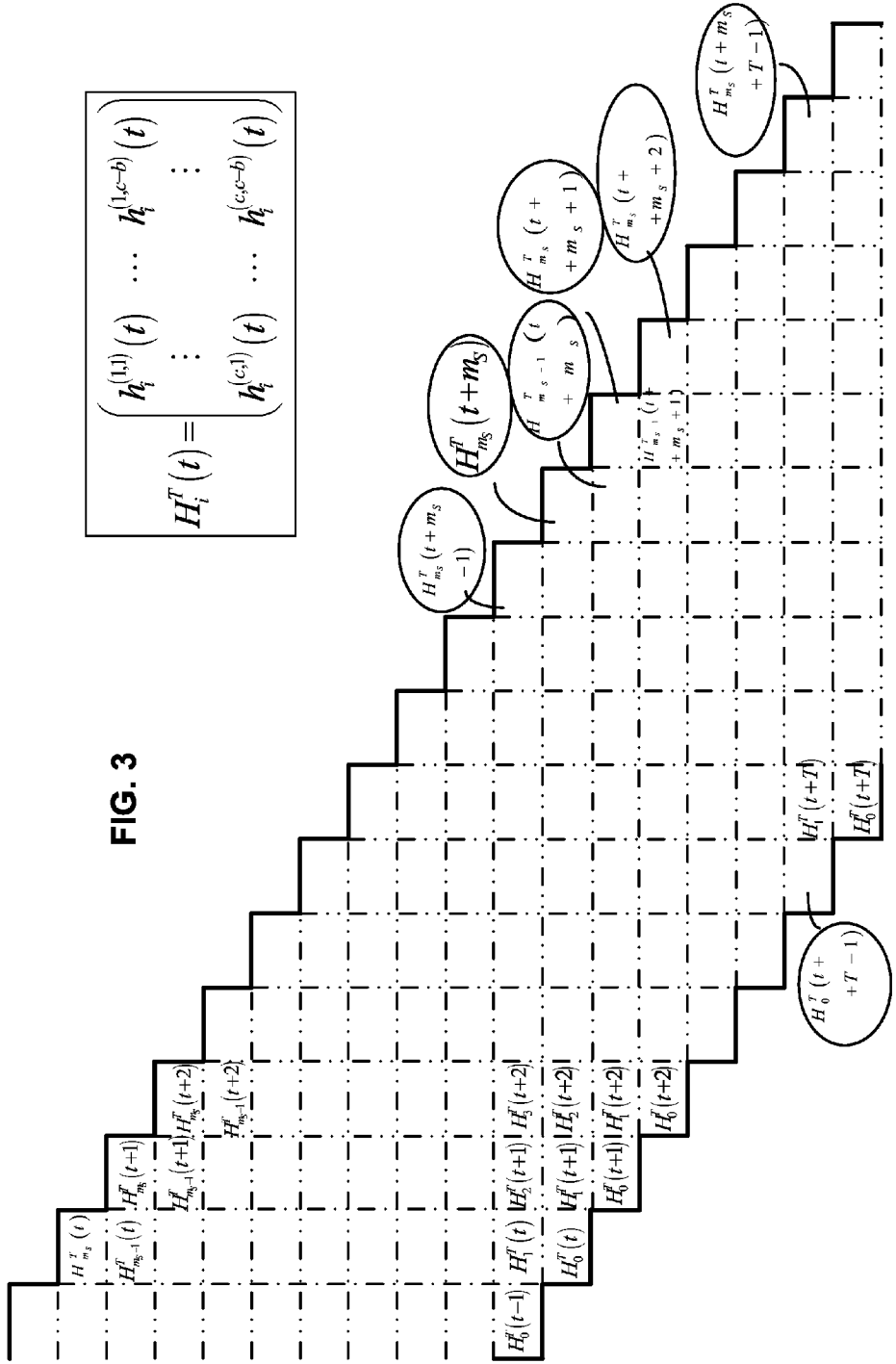
FIG. 3 shows the internal structure of the conventional exemplary semi-infinite LDPC-CC transposed parity check matrix shown in FIG. 2.

FIG. 3 shows the internal structure of the conventional exemplary semi-infinite LDPC-CC transposed parity check matrix shown in FIG. 2. The notation used for describing the sub-matrices is shown (inset), and the indices and time stamps of the sub-matrices in the matrix are also explicitly shown. The first sub-matrix in each row i is denoted as $H_0^T$(t+i). The last is denoted as $H_{m_s}^T$(t+$m_s$+i). For describing one whole period, i shall typically belong to a set of integers {0, T−1}.

Figure 4:
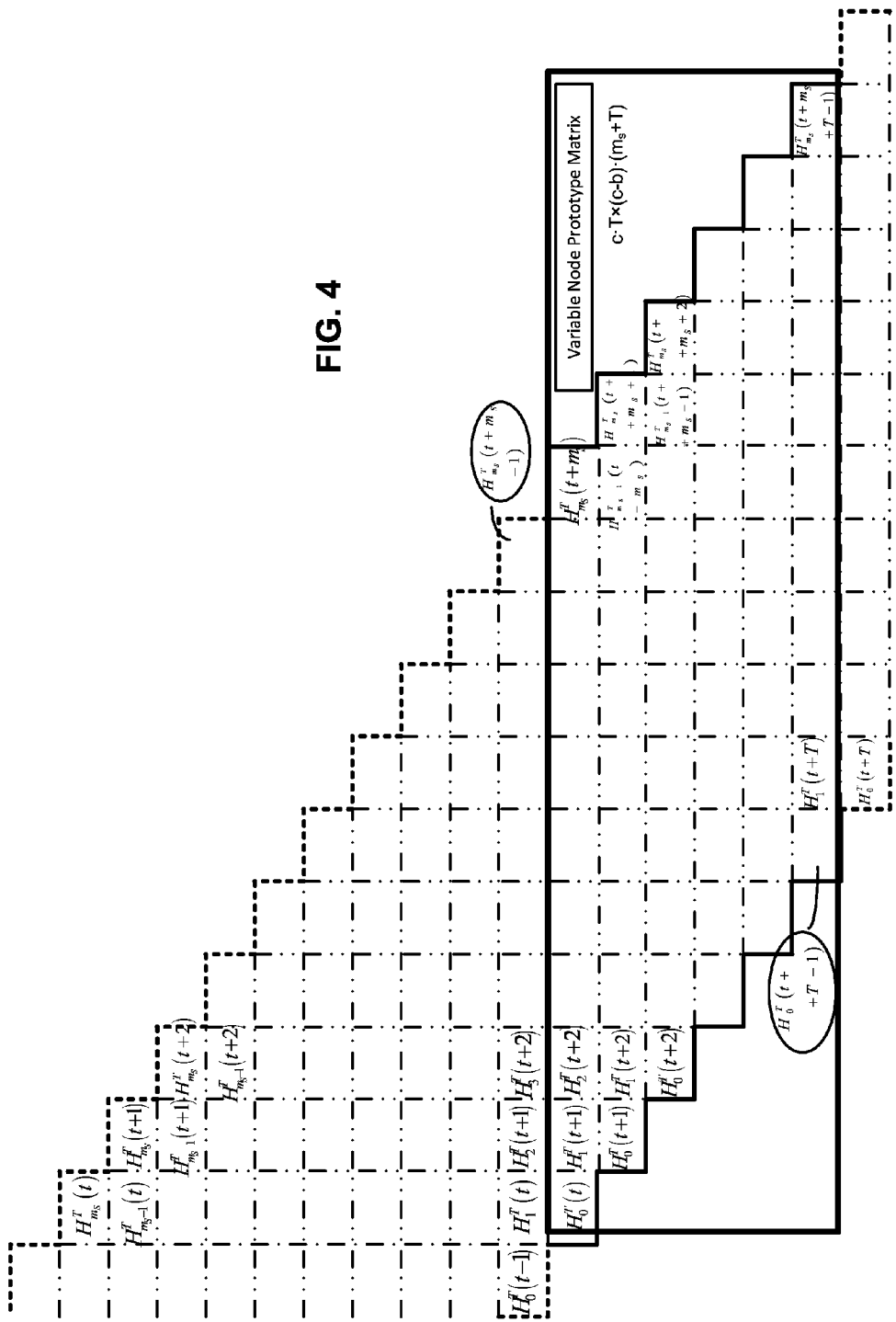
FIG. 4 is a diagram highlighting the Variable Node Prototype Matrix part of the semi-infinite LDPC-CC transposed parity check matrix of FIG. 3.

The Variable Node Prototype Matrix part of the semi-infinite LDPC-CC transposed parity check matrix of FIG. 3 is shown and described, in diagrammatic form, in FIG. 4. As here illustrated, the height of Variable Node Prototype Matrix is numerically represented and equal to c*T, while the width of the Variable Node Prototype Matrix is numerically represented and equal to (c−b)*($m_s$+T). Given these dimensions, the area of the given Variable Node Prototype Matrix may be represented as being of size c*T×(c−b)*($m_s$+T).

Figure 5:
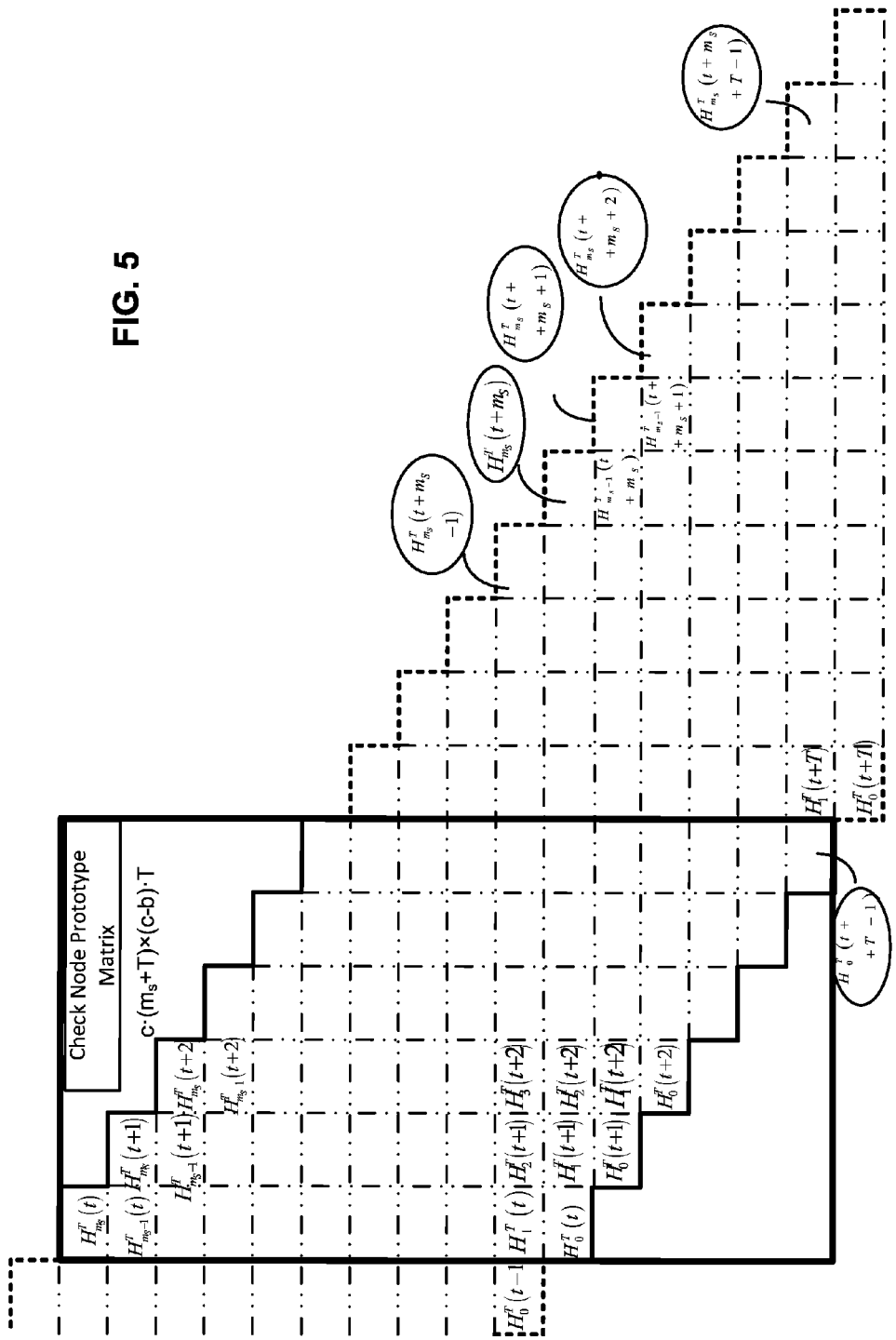
FIG. 5 is a diagram highlighting the Check Node Prototype Matrix part of the semi-infinite LDPC-CC transposed parity check matrix of FIG. 3.

Turning to FIG. 5, here is described and illustrated, in diagrammatic form, the Check Node Prototype Matrix part of the semi-infinite LDPC-CC transposed parity check matrix of FIG. 3. Here, the width and height of the Check Node Prototype Matrix are represented by c*($m_s$+T) and (c−b)*T, respectively. Given these dimensions, the area of the Check Node Prototype Matrix is represented as being of size c*($m_s$+T)×(c−b)*T.

Figure 6:
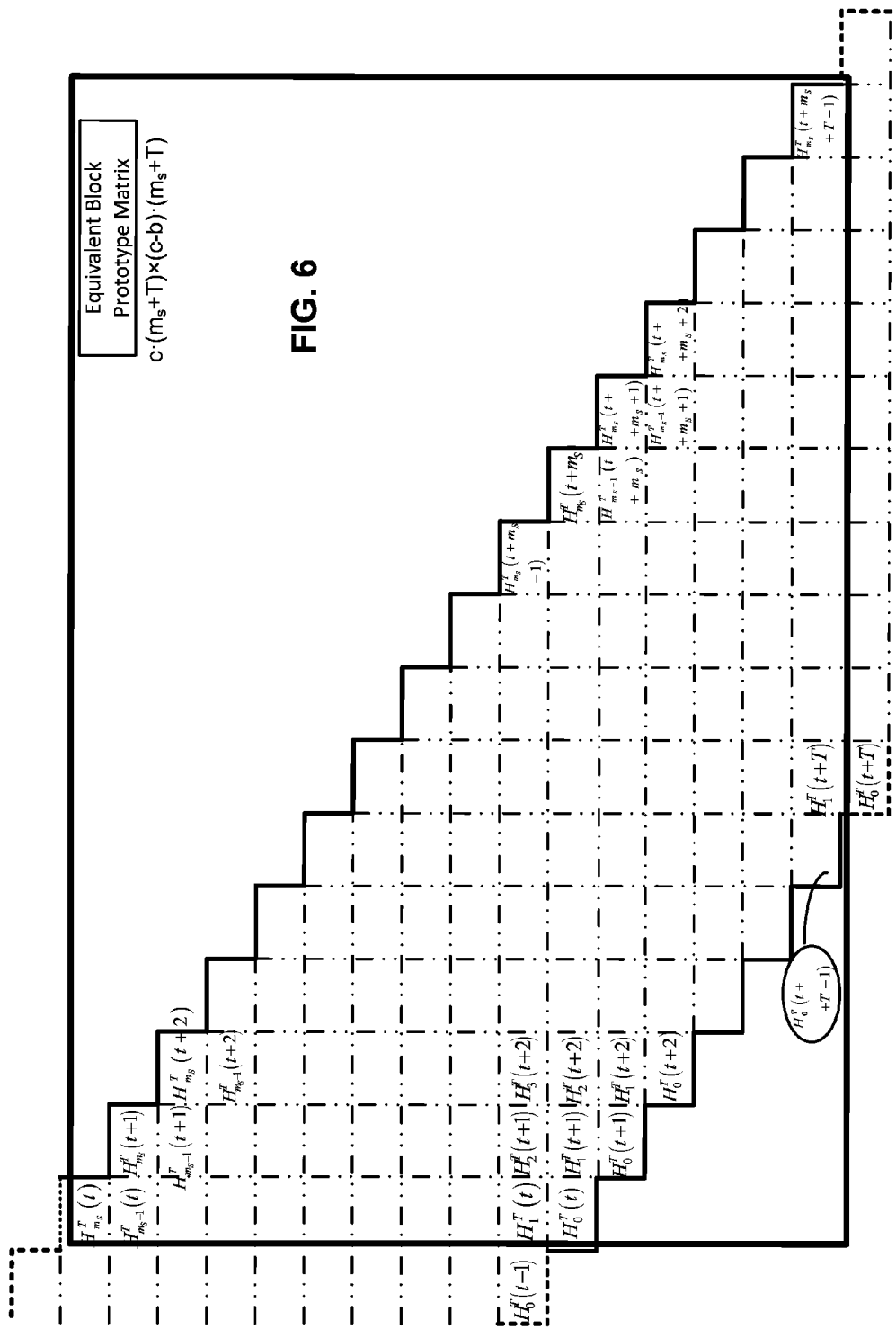
FIG. 6 is a diagram highlighting the equivalent Block Prototype Matrix part of the semi-infinite LDPC-CC transposed parity check matrix of FIG. 3.

Turning next to FIG. 6, here is described and illustrated, in diagrammatic form, a diagram highlighting the Equivalent Block Prototype Matrix part of the semi-infinite LDPC-CC transposed parity check matrix of FIG. 3. The width and height of the Equivalent Block Prototype Matrix are equal to c*($m_s$+T) and (c−b)*($m_s$+T), respectively. The area in turn of the Equivalent Block Prototype Matrix is represented as having size c*($m_s$+T)×(c−b)*($m_s$+T).

Figure 7:
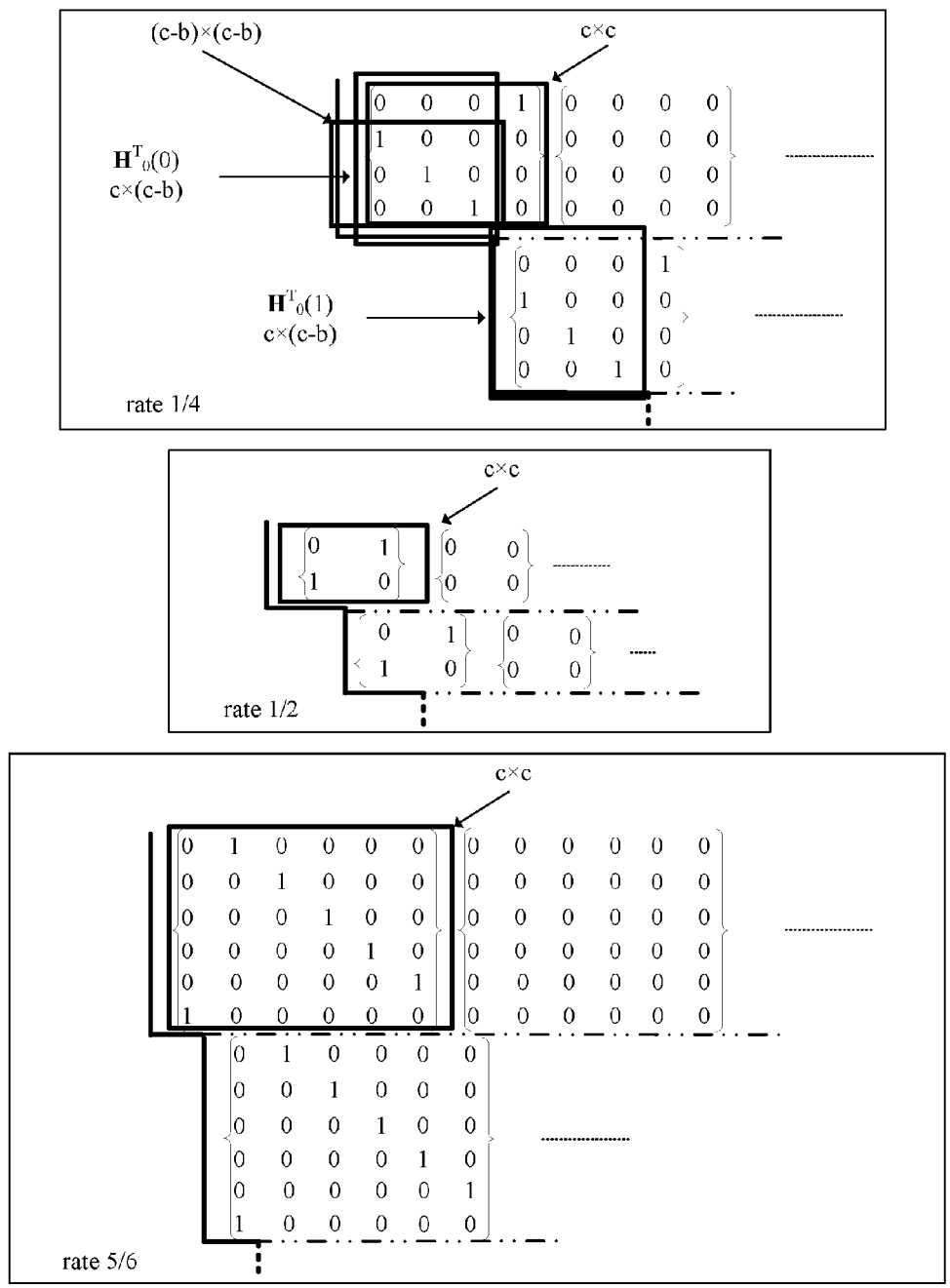
FIG. 7 shows examples of filling the first sub-matrices for each phase of the Variable Node Prototype Matrix of FIG. 4.

FIG. 7 shows examples of filling the first sub-matrices for each phase of the Variable Node Prototype Matrix of FIG. 4. A c×c permuted unit matrix incorporates the first c×(c−b) sub-matrix. In the examples of FIG. 7 the lower part of the c×(c−b) sub-matrix is a unit matrix. The first example is a code with rate equal to 1/4. The second example is a code with rate equal to 1/2. The third example is a code with a rate equal to 5/6.

Figure 8A:
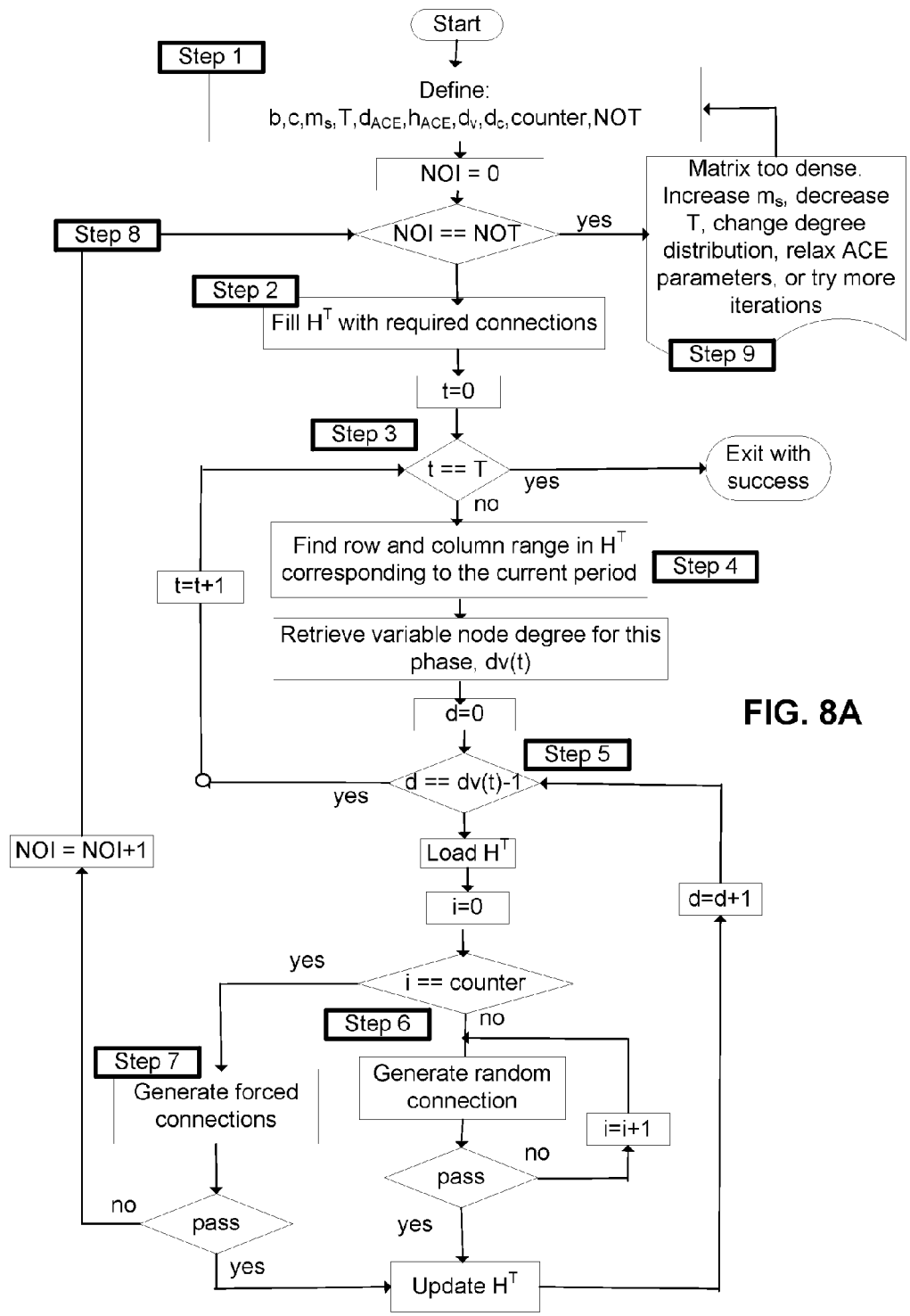
FIG. 8A is a flow diagram of a process of constructing LDPC-CC codes according to an exemplary embodiment.

FIG. 8A is a flow diagram of a process of constructing LDPC-CC codes according to an exemplary embodiment. The construction method starts with defining the design parameters (Step 1). For the particular embodiment, the design parameters and constraints are: Rate, Memory, Period, Degree Distribution, code Girth larger than 4 and specific connectivity specifications given in the form of ACE parameters.

Having defined the basic design parameters (Rate, Memory, Period), the precise size of the matrix to be produced at the output of the process is known, and appropriate storage is allocated. The outcome of this step is an empty matrix shell corresponding to the Variable Node Prototype Matrix of FIG. 4.

The rate and the period fully define the location of sub-matrices $H_0^T(t)$ in the Variable Node Prototype Matrix, i.e., the first non-zero sub-matrix per phase. These sub-matrices require connections (Step 2). According to an exemplary embodiment, randomly permuted c×c unit matrices are inserted in the cell incorporating $H_0^T(t)$, whose size is c×(c−b). In the case where systematic codes with fast encoding property are desired, these sub-matrices are filled with connections at certain places so that the lowest (c−b)×(c−b) part of all $H_0^T(t)$ is a (c−b)×(c−b) unit matrix.

Since the proposed process is based on inserting c×c permuted unit matrices, special permutations of the c×c unit matrix are placed in the c×c cell incorporating $H_0^T(t)$, whose size is c×(c−b). These permutations are given by the following equation:

$$p = \begin{cases} c-1, & b/c < 0.5 \\ 1-c, & b/c \geq 0.5 \end{cases} \quad \text{Equation (1)}$$

where positive values of p denote right-wise column permutation and negative values of p denote left-wise column permutation.

At this point, any other desired connections can be inserted. One example solution is to place connections at the last possible c×c cell of columns per phase, in order to "close" the matrix from the right side. This for example will ensure connections as far in time as possible, for every phase, for a given memory value.

Then, an iterative process begins, for each phase up to the period (Step 3).

First, the column indices in which possible connections can be placed are computed for the $\phi$-th phase, $\phi \in \{0, T-1\}$ (Step 4), as given in the following equation:

$$CS = \{\phi \cdot (c-b)+1, \ldots, \phi \cdot (c-b)+(c-b) \cdot (m_s+1)\} \quad \text{Equation (2)}$$

The variable node degree for this phase is retrieved, as originally specified in Step 1, and until the variable node degree for each phase is fulfilled, connections are placed in the allowed column indices specified by Equation 2 (Step 5). The variable node degree simply specifies the number of connections per row, per phase. For the proposed method, the c rows corresponding to a single phase must have the same degree, since unit matrices are used, and unit matrices have only one connection per row. If for phase t, the degree is $d_v$, then: The first connection per phase has already been placed in Step 2, so $d_v-1$ connections have to be placed, by inserting $d_v-1$ unit matrices. For each of these connections to be placed, the same procedure is followed.

In Step 6, a randomly permuted c×c unit matrix is generated and randomly placed within the column boundaries defined in Step 4. Random integers, called locations, are drawn from a set of integer values $[c+1, (c-b) \times (m_s+1)-c+1]$, using a uniform distribution.

One skilled in the art may appreciate that randomly selected indices can follow other distributions. Each location (integer) is translated into a column index in the syndrome former by assigning the location (integer) value, denoted as G, to the G-th index in the set shown in Equation (2), and choosing the corresponding element of this set, denoted as g. A randomly column permuted c×c unit matrix is placed in the cell defined by columns $[g, \ldots, g+c-1]$ and the c rows for this phase. The permutation value p is randomly drawn from a set of integer values $[0, \ldots, c-1]$, using a uniform distribution.

One skilled in the art may further appreciate that randomly selected permutations can follow other distributions. Choosing locations from the aforementioned set avoids the possibility that g defines a cell within the pre-defined connections of $H_0^T(t)$, $t \in \{0, T-1\}$, and outside the physical boundaries of the Variable Node Prototype Matrix.

If the generated connection is considered acceptable based on the results of a set of checks, then the algorithm continues to the next connection until the degree is satisfied (Step 5), and then to the next phase (Step 3).

If the generated connection fails to pass the set of tests more than a specific number of times, then the procedure continues to a "forced connections" section (Step 7).

If the algorithm succeeds to find a valid connection in Step 7, then the process is considered successful and the method continues to Step 5. If the algorithm in Step 7 fails, then the process starts again from the beginning (Step 8). If a large number of fails occur, then the process is aborted and the design parameters need to be re-defined (Step 9).

Figure 8B:
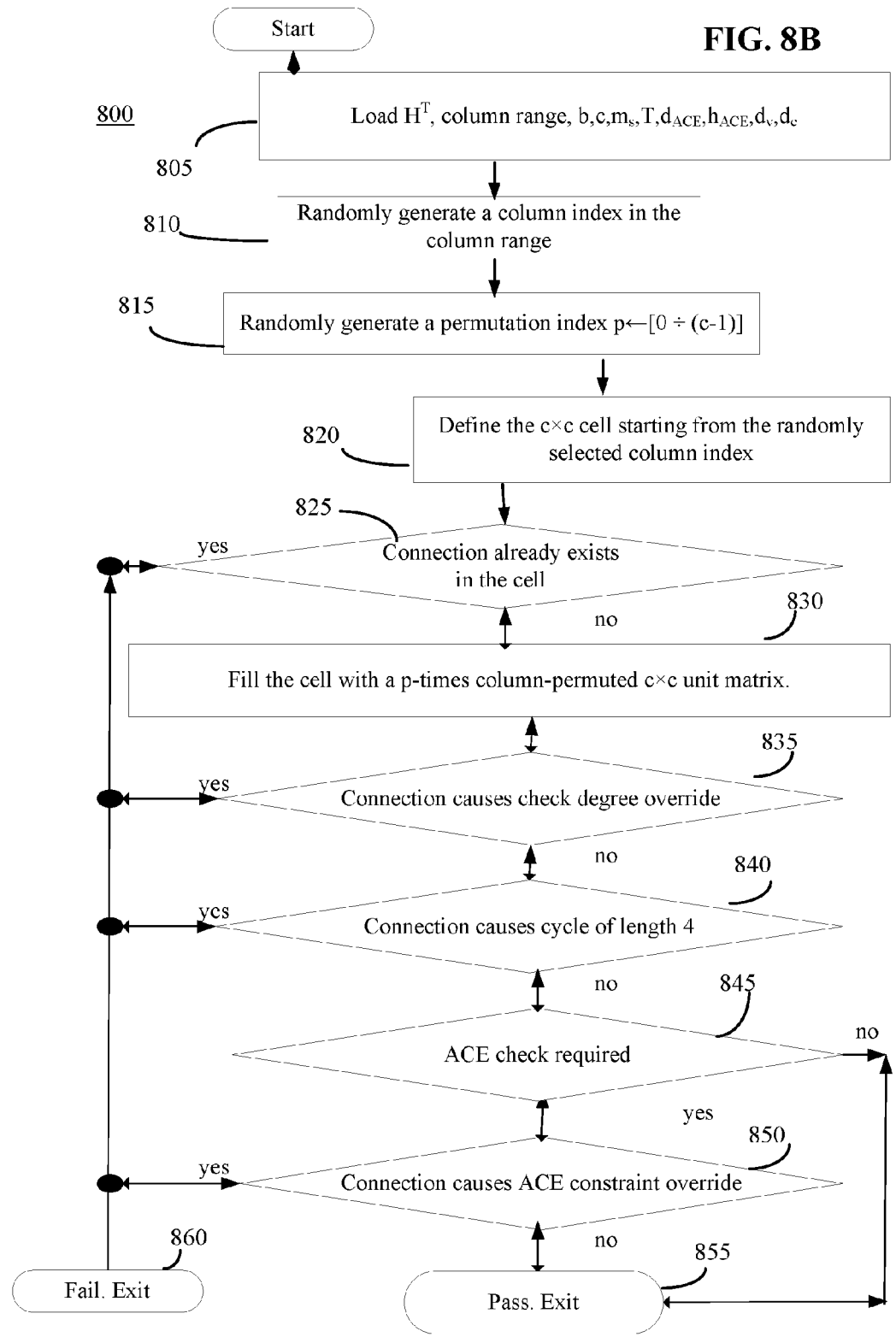
FIG. 8B is a flow diagram of a check procedure for the construction process of FIG. 8A.

FIG. 8B is a flow diagram 800 of a check procedure for the construction process of FIG. 8A. The c×c cell, defined with reference to the description of the flow chart of FIG. 8A, cannot fall outside the column boundaries for a specific phase. The matrix is inspected, to verify that no other connections exist in the cell (steps 805-825). Then, a check is performed to identify whether the new connection, if inserted, causes override of the check node degree in the Check Node Prototype Matrix of FIG. 5 (835). Then, another check is performed to identify whether the new connection, if inserted, causes the formation of a cycle of length 2*d in the Equivalent Block Prototype Matrix of FIG. 6 (840). If all checks are successful, and no connectivity design checks are required, the process ends with success (845, 855). If connectivity design issues are required, then a further check is performed (850).

For satisfying connectivity design issues, the ACE check algorithm used in this disclosure is an adaptation of an algorithm proposed by Tian et al. (*Selective Avoidance of Cycles in Irregular LDPC Code Construction, IEEE TRANSACTIONS ON COMMUNICATIONS, VOL. 52, NO. 8, AUGUST 2004*)).

The ACE check algorithm, originally developed for block codes, detects cycles that are likely contributors to small stopping sets which are identified and discarded. This method guarantees that cycles less than a given length $2d_{ACE}$, contain at least $h_{ACE}$ extrinsic paths, i.e., extrinsic variable nodes leading away from the cycle, guaranteeing useful message flow between nodes.

A set S of variable nodes in the Tanner graph is said to form a stopping set if all its neighbouring check nodes are connected to S at least twice.

The general idea of the ACE detection method is to expand the tree of nodes as defined in the Tanner graph representation of the code, to a depth $2d_{ACE}$, starting from a root variable node, and count the number of extrinsic check nodes up to this depth. At the end, all cycles less than $2d_{ACE}$ have an ACE value greater than $h_{ACE}$. ACE is a calculable (approximate) EMD metric, where EMD of a variable-node set is defined as the number of extrinsic check nodes of this set, and an extrinsic check node of a variable-node set is a check node that is singly connected to this set.

In the modified ACE detection algorithm proposed in the present disclosure, the Equivalent Block Prototype Matrix of the syndrome former is used. Only variable nodes belonging to the Variable Node Prototype Matrix portion of the Equivalent Block Prototype Matrix are considered as root nodes, i.e., variable nodes that have full degree.

The modified ACE detection algorithm starts from a variable node $v_0$. Memory is allocated for storing: i) The ACE value of every variable node, defined as $d_v-2$; ii) An enumeration variable for each variable node, with two states (ACTIVE or INACTIVE), indicating if a variable node must be taken into account; iii) The ACE value of the path from the root node to each of the variable nodes. This memory is initialized with $\infty$ (i.e., unvisited); iv) An enumeration variable for each check node, with two states (ACTIVE or INACTIVE), indicating if a check node must be taken into account; v) The ACE value of the path from the root node to each of the check nodes. This memory is initialized with $\infty$ (i.e., unvisited).

We define $p(\mu_t)$ to be the ACE of a path between root node $v_0$ and an arbitrary node $\mu_t$ (it can be either a variable node or a check node). For ACE values of nodes, $ACE(\mu_t)=\text{degree}(\mu_t)-2$ if $\mu_t$ is a variable node, and $ACE(\mu_t)=0$ if $\mu_t$ is a check node.

The algorithm starts from $v_0$ and sets this variable node as ACTIVE which serves as a parent node. At subsequent depths up to $2d_{ACE}$, ACTIVE nodes are considered as parent nodes. For every parent node in a particular depth, the children nodes are found, i.e., nodes to which the parent connects to. For each child node $\mu_t$, a $p_{temp}$ value is calculated as $p(\mu_t)+ACE(\mu_t)$, loaded from the appropriate memory elements. If $p_{temp}+p(\mu_t)-ACE(v_0)-ACE(\mu_t)<h_{ACE}$, then the matrix has surpassed the ACE design criteria and the algorithm exits with failure, i.e. the path has ACE value lower than specified. If this is false, i.e. if $p_{temp} \geq p(\mu_t)$, then the child node is INACTIVE with respect to the current parent node. If this is false, then $p(\mu_t)$ is replaced by $p_{temp}$, and the child node is ACTIVE for the specific parent. The current depth increases, and the previously child nodes that were ACTIVE are the new parent nodes. The algorithm continues until there is an exit with failure, or until the predefined depth is reached.

The adaptation in this disclosure allows the algorithm to be performed on LDPC-CCs. The novel feature of the adaptation is i) the use of the ACE detection algorithm in the field of LDPC-CCs; and, inter alia, ii) the use of the ACE check algorithm on the Equivalent Block Prototype Matrix defined in FIG. 6.

In one scenario, the root (starting) variable nodes for the ACE check algorithm are only the nodes belonging to the Variable Node Prototype Matrix part of the Equivalent Block Prototype Matrix, i.e., variable nodes shown in the shaded part of FIG. 4. If the check is successful, the procedure ends and returns to Step 5. If the check is unsuccessful then the algorithm goes back to Step 6.

Figure 9:
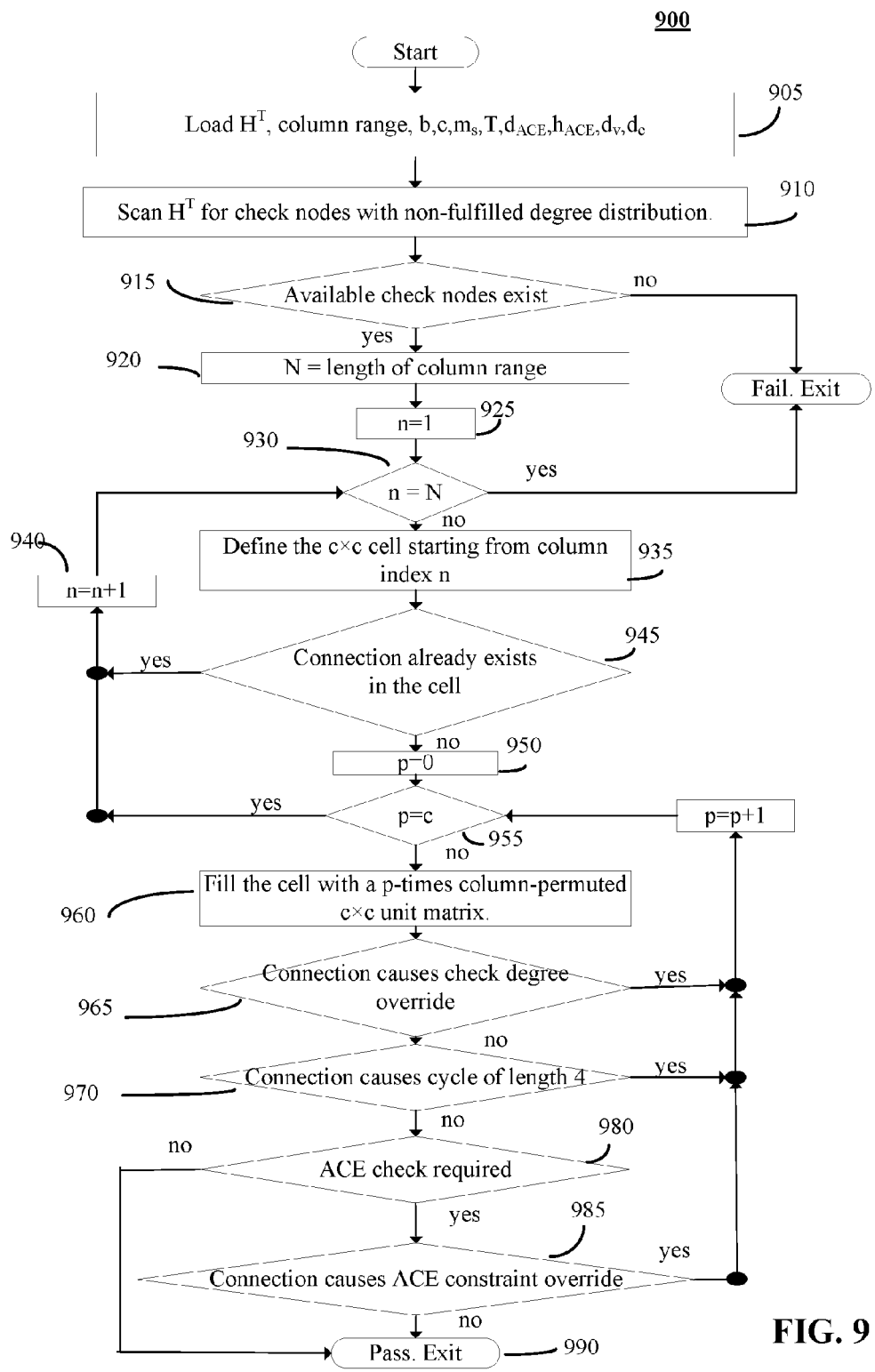
FIG. 9 is a flow diagram for a forced connections routibe for the construction process of FIG. 8A.

FIG. 9 is a flow diagram for a forced connections routine 900 for the construction process of FIG. 8A. In a first step, the check node degree of the matrix is compared to the desired check node degree to check whether the Check Node Prototype Matrix has full check node degree (905, 910). If the comparison is successful, i.e. the Check Node Prototype Matrix does not have full check node degree (915), then every possible column in the column range corresponding to the current phase is tried (925-990), and for each column, each possible permutation is tried, using the check procedure already described with reference to FIG. 8B.

The first connection that satisfies all the checks produces a pass, and the method exits with success back to Step 5. If all possible combinations produce a fail, the algorithm exits with a fail to Step 8.

The aforementioned construction method leads to a polynomial representation of the Variable Node Prototype Matrix, which can also be extended to a compact matrix notation. The Variable Node Prototype Matrix is defined as a set of T polynomials, of up to c variables, of maximum $m_s+1$ elements each. The elements of the polynomial are denoted as $x_j^i$, where $i \in \{0, \ldots, m_s\}$ denotes the column index at which the connection resides, with respect to the first variable node of the phase, and $j \in \{0, \ldots, c-1\}$ denotes the column permutation value for the c×c unit matrix for this set of connections, for the specific phase. For example, the polynomial for phase $\varphi$ is denoted as $$P_\varphi(x_0, \ldots, x_{c-1}) = \sum_{i=0}^{c-1} \sum_{j=0}^{m_s} a_{i,j} x_i^j \quad \text{Equation (3)}$$

where $a_{i,j}=\{0,1\}$ determines the existing connections.

A similar matrix representation utilizes the delay operator D to convey the same information in matrix form. Each polynomial is transformed into a polynomial of the delay operator D, with a straightforward manner, i.e., $P_\varphi(x) \rightarrow P_\varphi(D)$ and $x_i^j \rightarrow D_i^j$. The LDPC-CC Variable Node Prototype Matrix is given by $$H^T(D) = \begin{pmatrix} P_0(D) \\ DP_1(D) \\ \vdots \\ D^{T-1} P_{T-1}(D) \end{pmatrix} = \begin{pmatrix} \sum_{i=0}^{c-1} \sum_{j=0}^{m_s} a_{i,j} D_i^j \\ D \sum_{i=0}^{c-1} \sum_{j=0}^{m_s} a_{i,j} D_i^j \\ \vdots \\ D^{T-1} \sum_{i=0}^{c-1} \sum_{j=0}^{m_s} a_{i,j} D_i^j \end{pmatrix} \quad \text{Equation (4)}$$

where $a_{i,j}=\{0,1\}$ determines the existing connections. Both representations are useful in the sense that the Variable Node Prototype Matrix can be represented in a compact mathematical formulation, easily placed in written form, and easily stored in hardware memory elements.

The aforementioned construction method can be extended, with a small modification, to non-binary LDPC-CC codes.

Figures 10A, 10B:
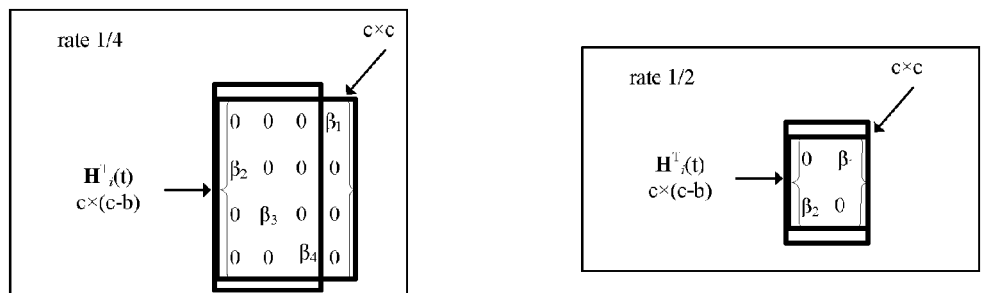
FIG. 10A shows a generalization of the definition of the elements of the sub-matrices depicted in FIGS. 3-6 for non-binary LDPC-CC codes.
FIG. 10B shows a generalization of two of the example scenarios in FIG. 7 for non-binary LDPC-CC codes.

FIG. 10A shows a generalization of the definition of the elements of the sub-matrices depicted in FIGS. 3-6 for non-binary LDPC-CC codes. In the case of non-binary LDPC-CC codes the matrix $H_i^T(t)$ is comprised of elements belonging to $GF(2^v)$, $v \in Z+\backslash\{0,1\}$.

FIG. 10B shows a generalization of two of the examples of FIG. 7 for non-binary LDPC-CC codes. For the specific construction method, c×c cells are defined and each contains c non-zero elements, each of which belongs to $GF\{2^v\}\backslash\{0\}$.

The essential difference between the non-binary version of the construction method and the binary version of the construction method is that, while constructing the Variable Node Prototype Matrix, binary connections must be replaced by non-binary connections.

It is stressed that the replacement of binary with non-binary elements is performed as the Variable Node Prototype Matrix is constructed, after the successful placement of a randomly permuted c×c unit matrix, and not in a bulky way upon the final result of the binary construction method.

The insertion of non-binary elements is performed after the acceptance of the binary connections, since non-binary codes retain the properties of the underlying binary codes. Non-binary elements (connections) are inserted in the place of binary connections (elements), by randomly choosing elements from $GF(2^v)\backslash\{0\}$, $v \in Z+\backslash\{0,1\}$, using a uniform distribution, though other distributions may also be used. This procedure holds for both the required connections and the randomly inserted connections.

Figure 11:
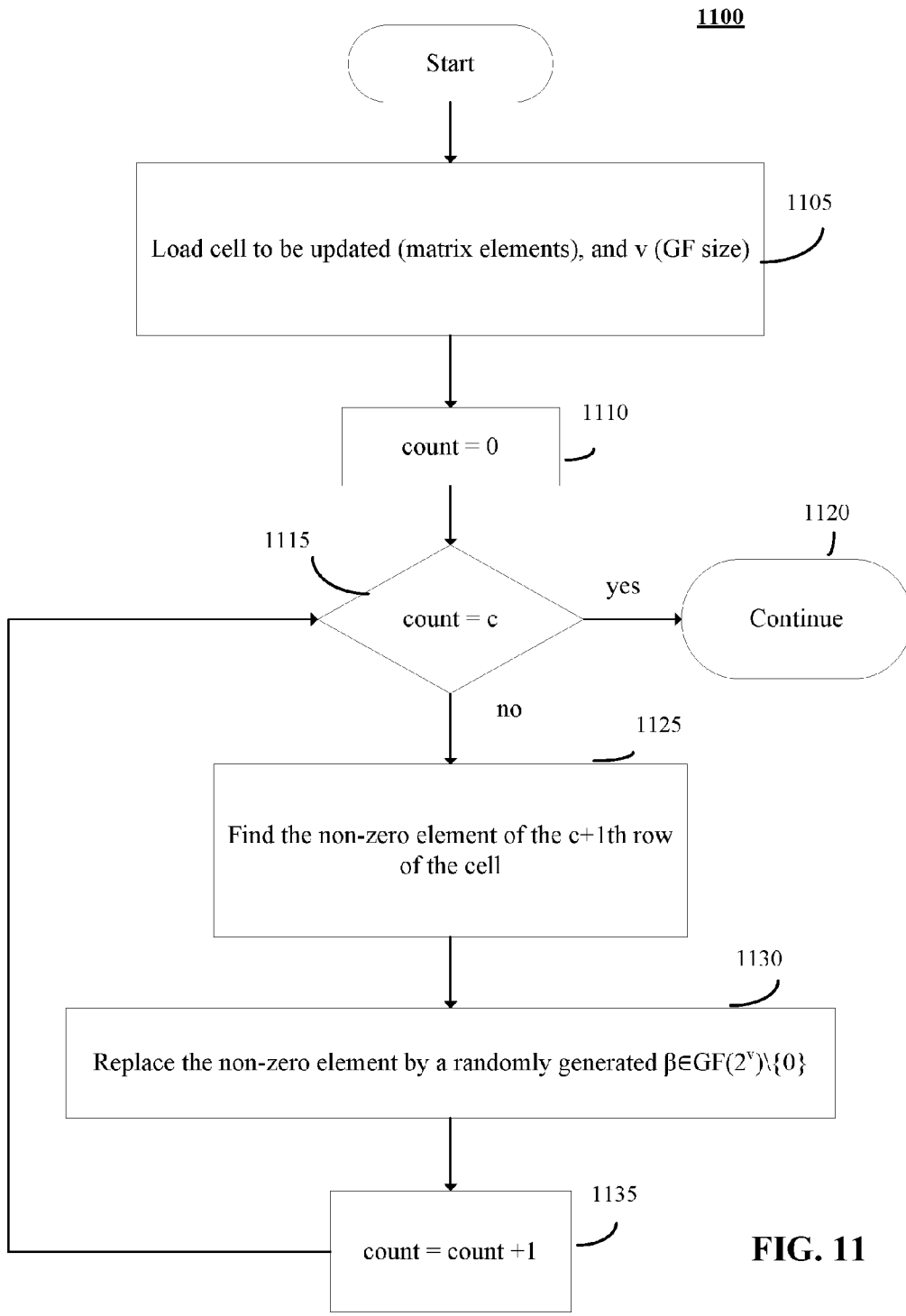
FIG. 11 shows a flow diagram of an algorithm for constructing non-binary LDPC-CC codes according to the exemplary embodiment of FIGS. 10A-10B.

FIG. 11 shows a flow diagram of an algorithm 1100 for constructing non-binary LDPC-CC codes according to the exemplary embodiment of FIG. 10. The algorithm operates on c×c matrix elements. The algorithm steps are represented by blocks 1105 to 1135.

Figure 12:
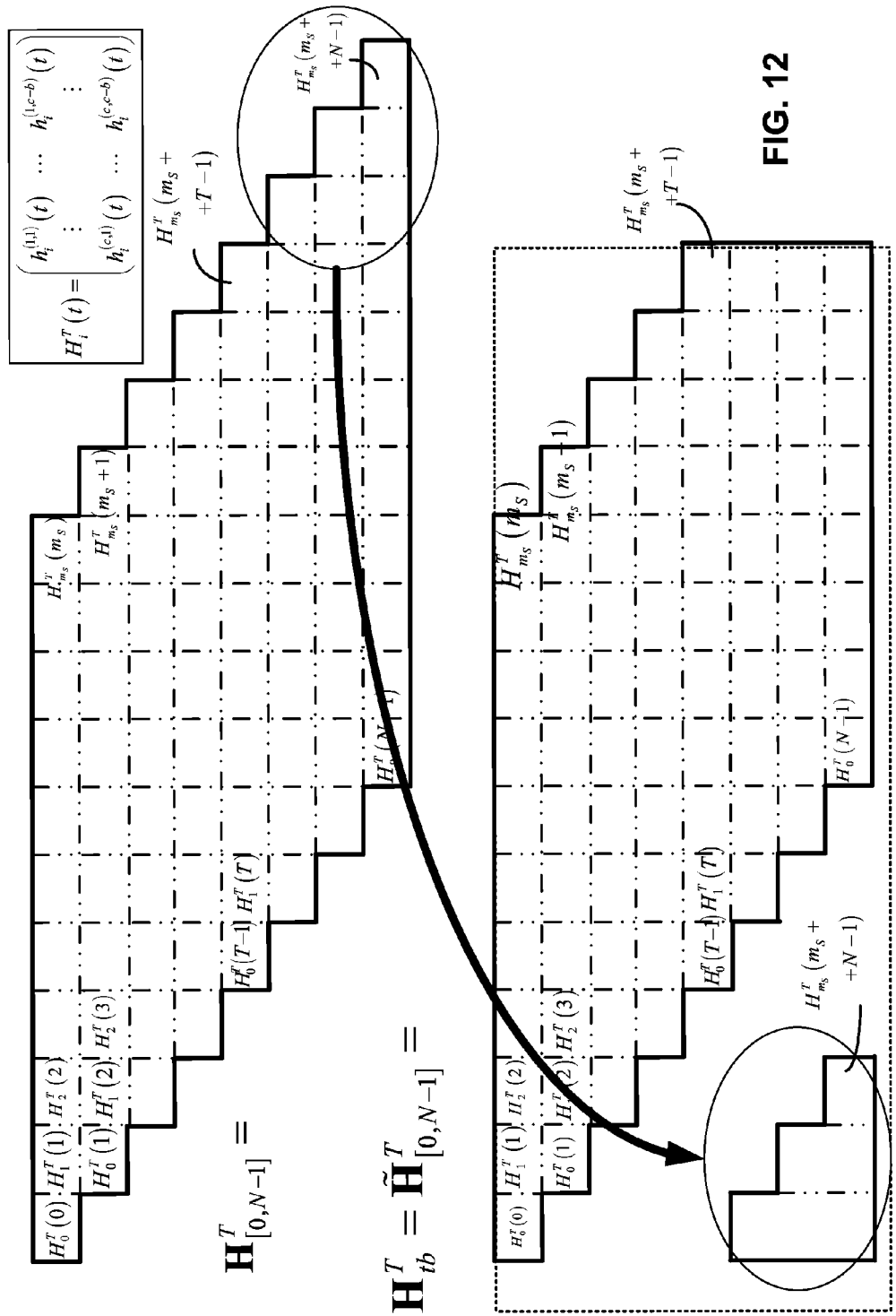
FIG. 12 is a diagram illustrating the construction of an LDPC-CC tailbiting matrix.

FIG. 12 is a diagram illustrating the construction of a tailbiting matrix. For LDPC-CC codes, the desired frame size to be sent is denoted by the number of blocks of size c to be transmitted, denoted as N. N must be larger than the period T. The part of the syndrome former $H^T$, corresponding to a frame of size N, is denoted as $H_{[0,N-1]}^T$, and similarly with the Variable Node Prototype Matrix, has all of its rows in full expansion, i.e., even the last row has $m_s+1$ sub-matrices. The tailbiting matrix $H_{tb}^T = \tilde{H}_{[0,N-1]}^T$, is formed by wrapping the last $m_s$ columns of sub-matrices of $H_{[0,N-1]}^T$ to the first $m_s$ columns of sub-matrices of the same matrix. Since encoding for tailbiting LDPC-CC codes is similar to LDPC-BC encoding, i.e., it is based on matrix multiplication, and a part of $H_{tb}^T$ must be invertible.

After the construction of a matrix using the method of FIG. 8A, expressed by the resulting Variable Node Prototype Matrix, a tailbiting matrix is attempted to be constructed, in the sense that a part of the matrix must be invertible. A range of frame sizes are used, which involves setting a minimum and maximum frame size in the close vicinity of the target frame size, and checking whether the Variable Node Prototype Matrix can be used as a tailbiting matrix for frame sizes between these values with a given step. This involves the inversion of the specific portion of $H_{tb}^T$ for the specific frame size. The frame sizes for which the LDPC-CC matrix is invertible and therefore the tailbiting matrix constructible are therefore found.

Figure 13:
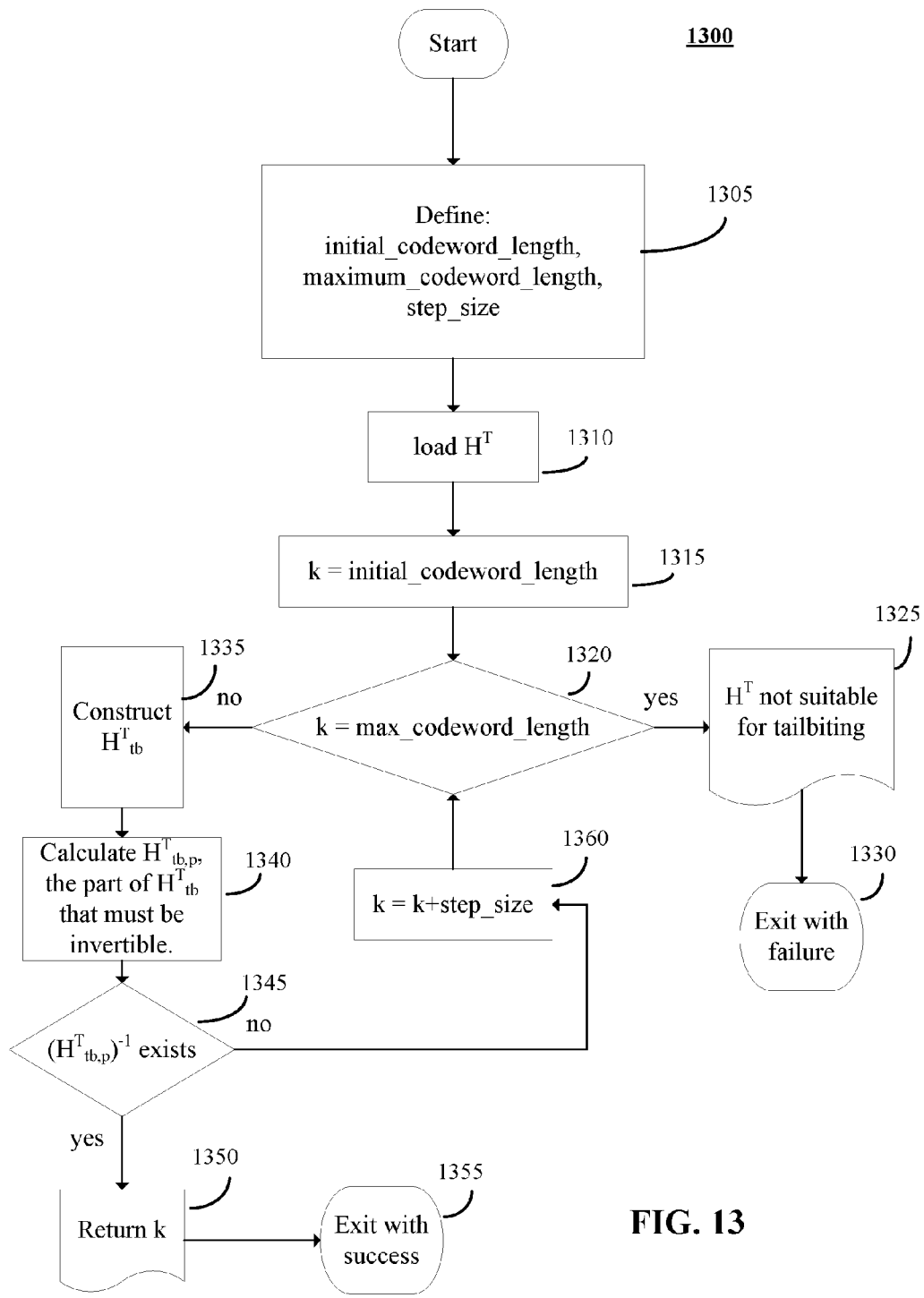
FIG. 13 is a flow diagram of a process of constructing the tailbiting matrix of FIG. 12.

FIG. 13 is a flow diagram of a routine 1300 of constructing the tailbiting matrix of FIG. 12. For a given Variable Node Prototype Matrix, the method scans through a number of frame sizes until a tailbiting matrix is successfully generated. The algorithm steps of routine 1300 are explained in greater detail by the representations given by corresponding blocks 1305 to 1355.

Figure 14:
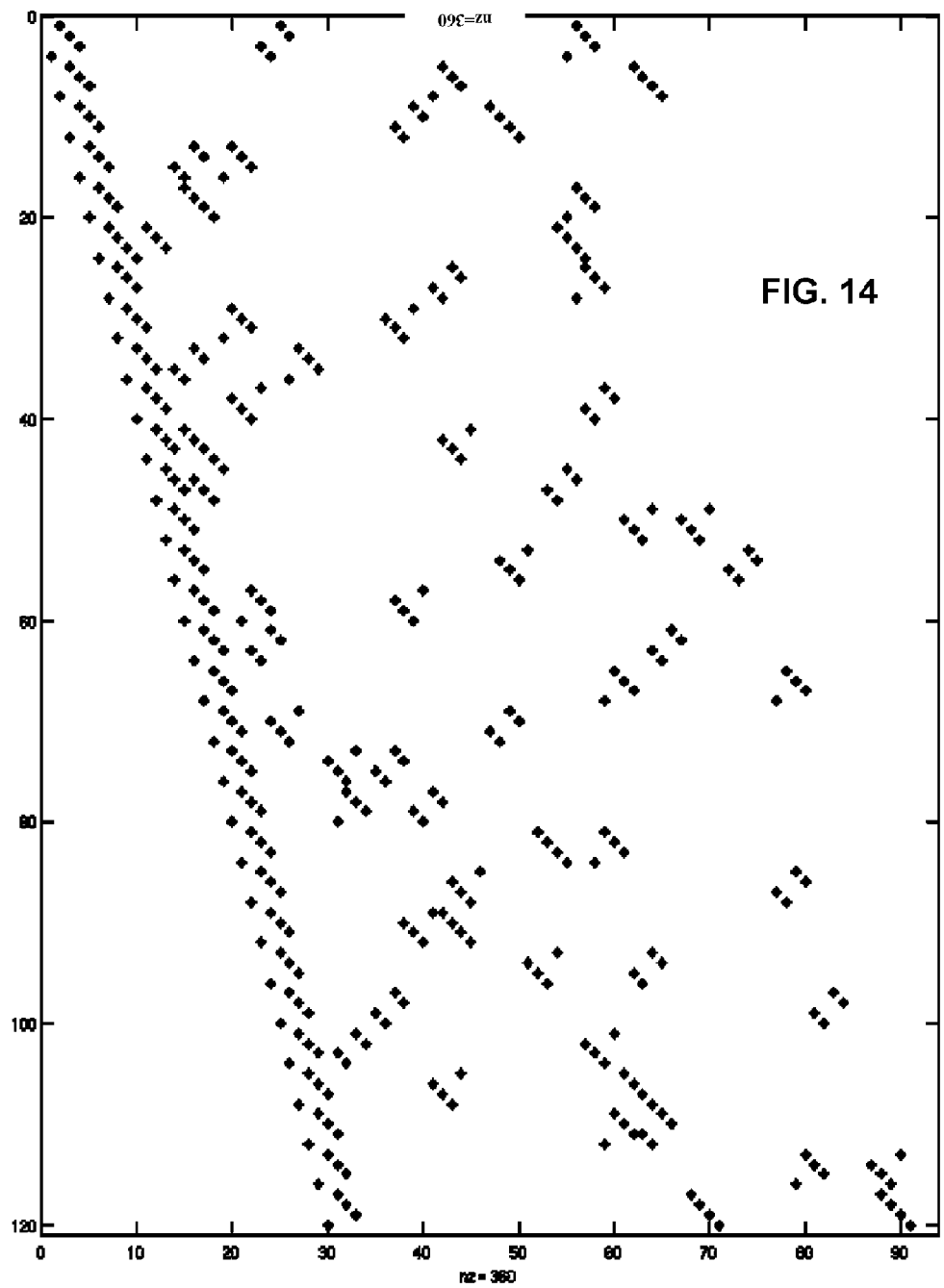
FIG. 14 shows an example of a part of a syndrome former constructed with the process of FIG. 8A.

FIG. 14 shows an example of a part of a Variable Node Prototype Matrix constructed with the process of FIG. 8A. In this scenario, the Variable Node Prototype Matrix has rate 3/4, $m_s=63$, T=30, average $d_v=3$ (120 variable nodes with degree 3), average $d_c=12$ (1 check node with degree 9, 2 check nodes with degree 10, 4 check nodes with degree 11, 12 check nodes with degree 12, 11 check nodes with degree 13).

Figure 15:
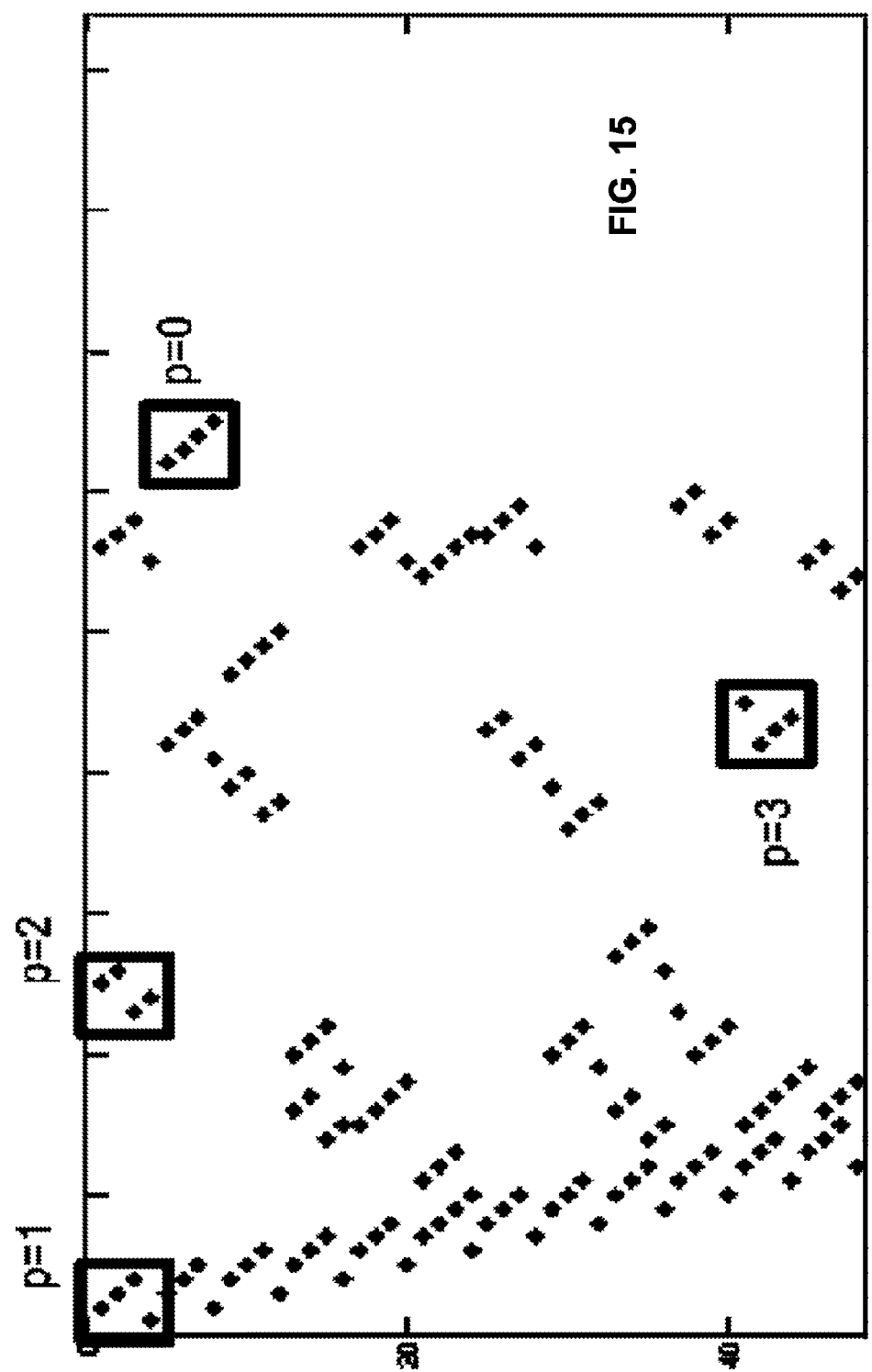
FIG. 15 is a detailed diagram showing the first phases of the matrix of FIG. 14, with all allowable permutations.

FIG. 15 is a detailed diagram showing the first phases of the matrix of FIG. 14, with all allowable permutations. The four different possible permutations are explicitly shown.

Figure 16:
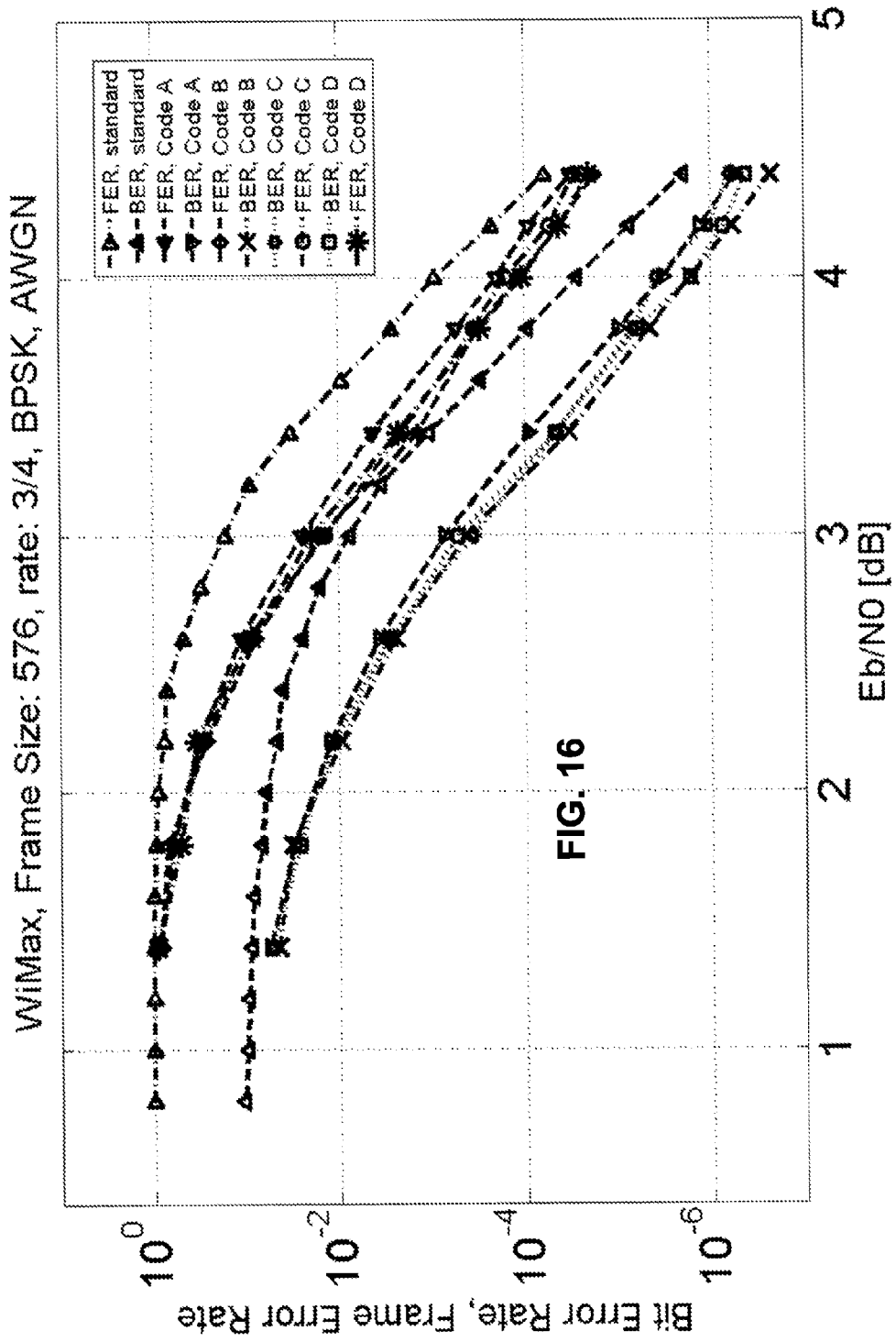
FIG. 16 is a diagram showing the Bit-Error Rate (BER) and Frame-Error Rate (FER) for various LDPC-CC codes for Frame size equal to 576 and code rate 3/4.

FIG. 16 is a diagram showing the Bit-Error Rate (BER) and Frame-Error Rate (FER) for various LDPC-CC codes for Frame size equal to 576. These are BER and FER results for an example scenario equivalent to the IEEE 802.16e standard.

Frame size: 576 bits; Rate: 3/4; Modulation format: BPSK.
Code characteristics:
i) Code A:
No ACE detection incorporated; $m_s=63$, T=30, average $d_v=3$ (120 variable nodes with degree 3), average $d_c=12$ (1 check node with degree 9, 2 check nodes with degree 10, 4 check nodes with degree 11, 12 check nodes with degree 12, 11 check nodes with degree 13);
ii) Code B:
No ACE detection incorporated; $m_s=63$, T=30, average $d_v=3$ (120 variable nodes with degree 3), average $d_c=12$ (1 check node with degree 8, 2 check nodes with degree 9, 8 check nodes with degree 11, 6 check nodes with degree 12, 8 check nodes with degree 13, and 5 check nodes with degree 14);
iii) Code C:
ACE detection incorporated; $m_s=63$, T=25, average $d_v=3$ (100 variable nodes with degree 3), average $d_c=12$ (1 check node with degree 10, 7 check nodes with degree 11, 8 check nodes with degree 12, 9 check nodes with degree 13);
iv) Code D:
ACE detection incorporated; $m_s=63$, T=20, average $d_v=3$ (80 variable nodes with degree 3), average $d_c=12$ (8 check node with degree 11, 4 check nodes with degree 12, 8 check nodes with degree 13).

Figure 17:
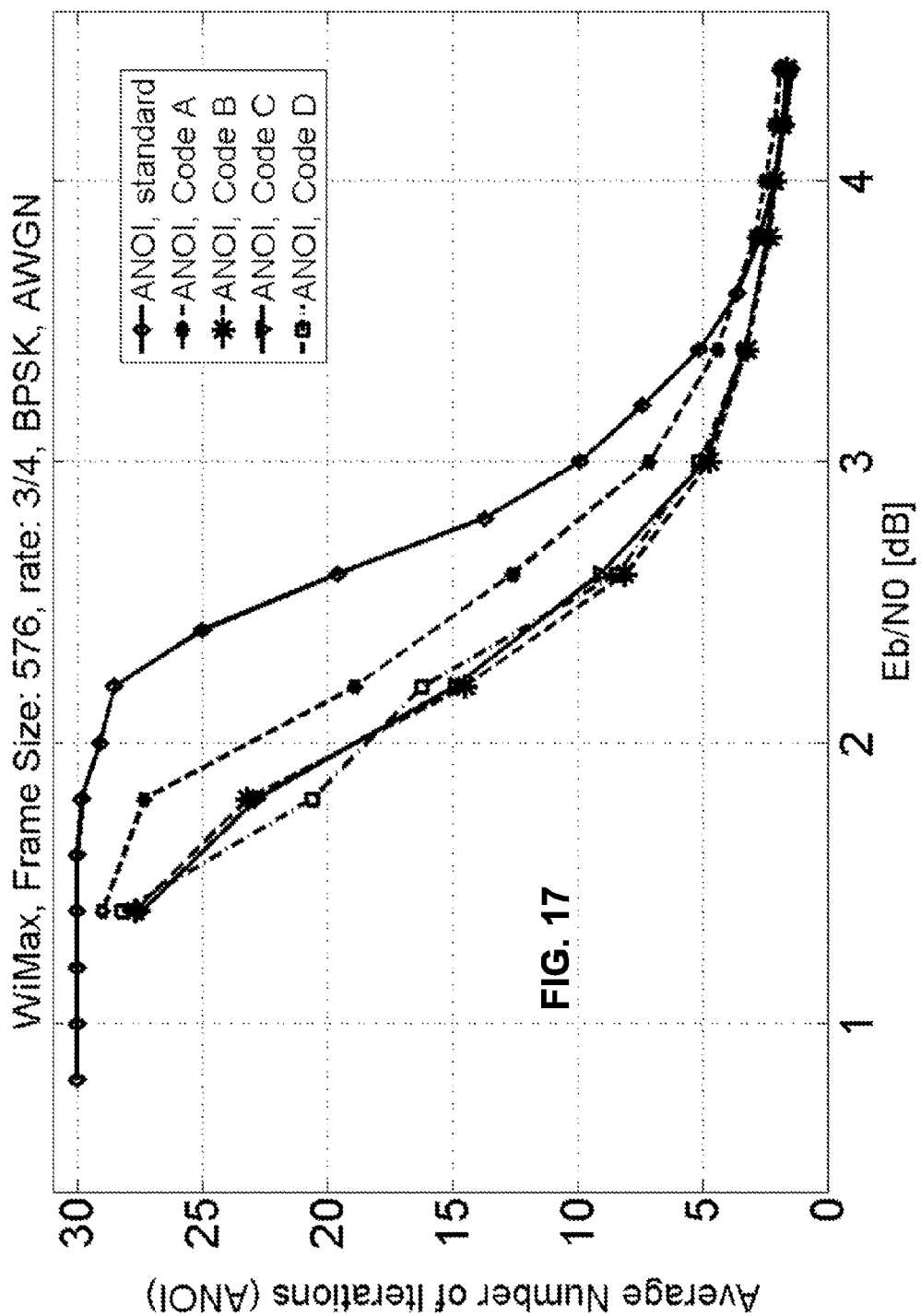
FIG. 17 is a diagram showing the Average Number of Iterations (ANOI) for various LDPC-CC codes for Frame size equal to 576 and code rate 3/4.

FIG. 17 is a diagram showing the Average Number of Iterations (ANOI) for various LDPC-CC codes for Frame size equal to 576. Rate: 3/4; Modulation format: BPSK. The code characteristics are similar to those in FIG. 16.

Figure 18:
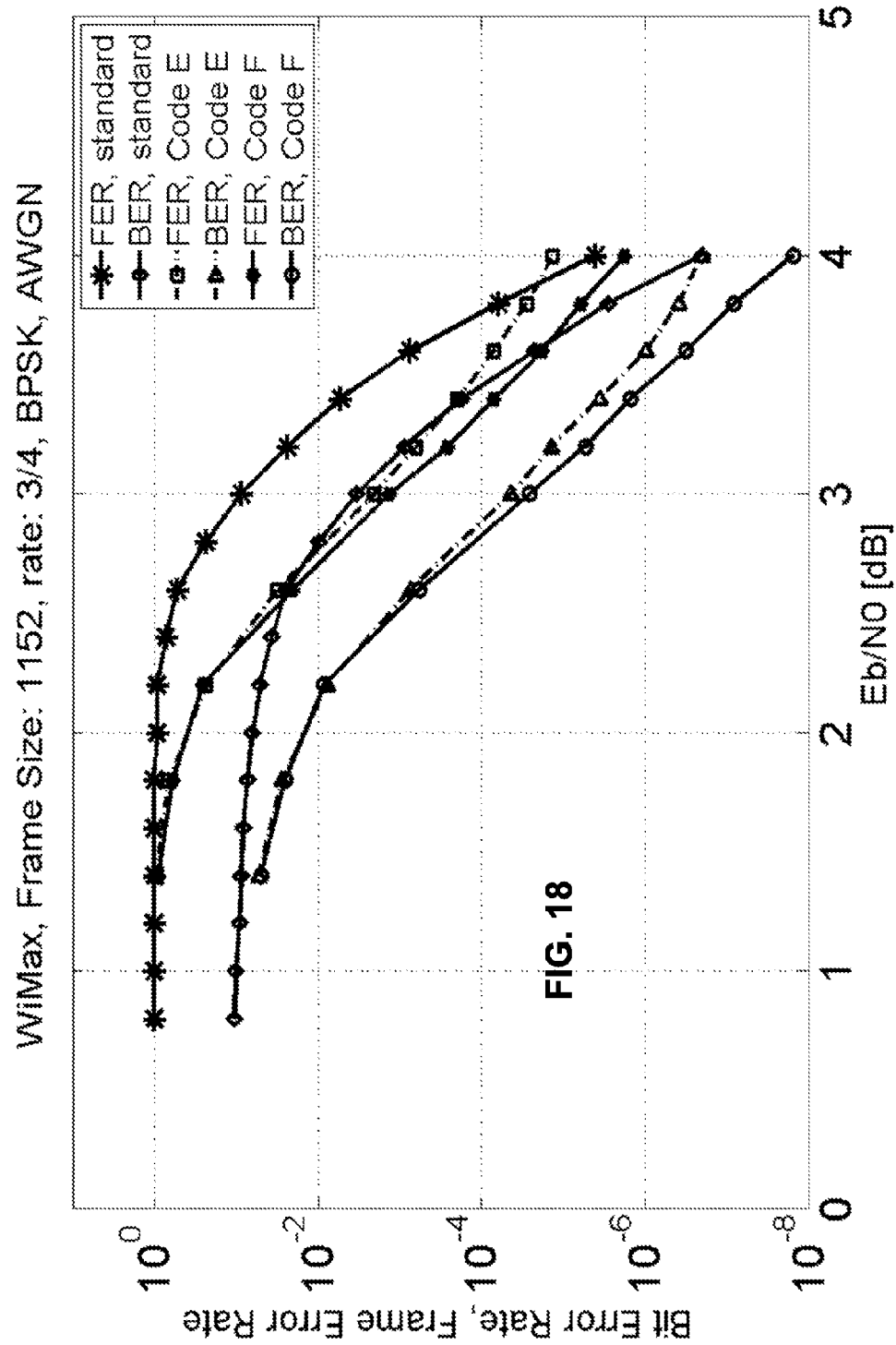
FIG. 18 is a diagram showing the Bit-Error Rate (BER) and Frame-Error Rate (FER) results for various LDPC-CC codes for Frame size equal to 1152 and code rate 3/4.

FIG. 18 is a diagram showing the Bit-Error Rate (BER) and Frame-Error Rate (FER) results for various LDPC-CC codes for Frame size equal to 1152. Rate: 3/4; Modulation format: BPSK.

Code characteristics:
i) Code A:
No ACE detection incorporated; $m_s=127$, T=63, average $d_v=3$ (252 variable nodes with degree 3), average $d_c=12$ (2 check nodes with degree 9, 3 check nodes with degree 10, 13 check nodes with degree 11, 20 check nodes with degree 12, 25 check nodes with degree 13);
ii) Code B:
ACE detection incorporated; $m_s=127$, T=63, average $d_v=3$ (252 variable nodes with degree 3), average $d_c=12$ (8 check node with degree 10, 12 check nodes with degree 11, 15 check nodes with degree 12, 28 check nodes with degree 13).

Figure 19:
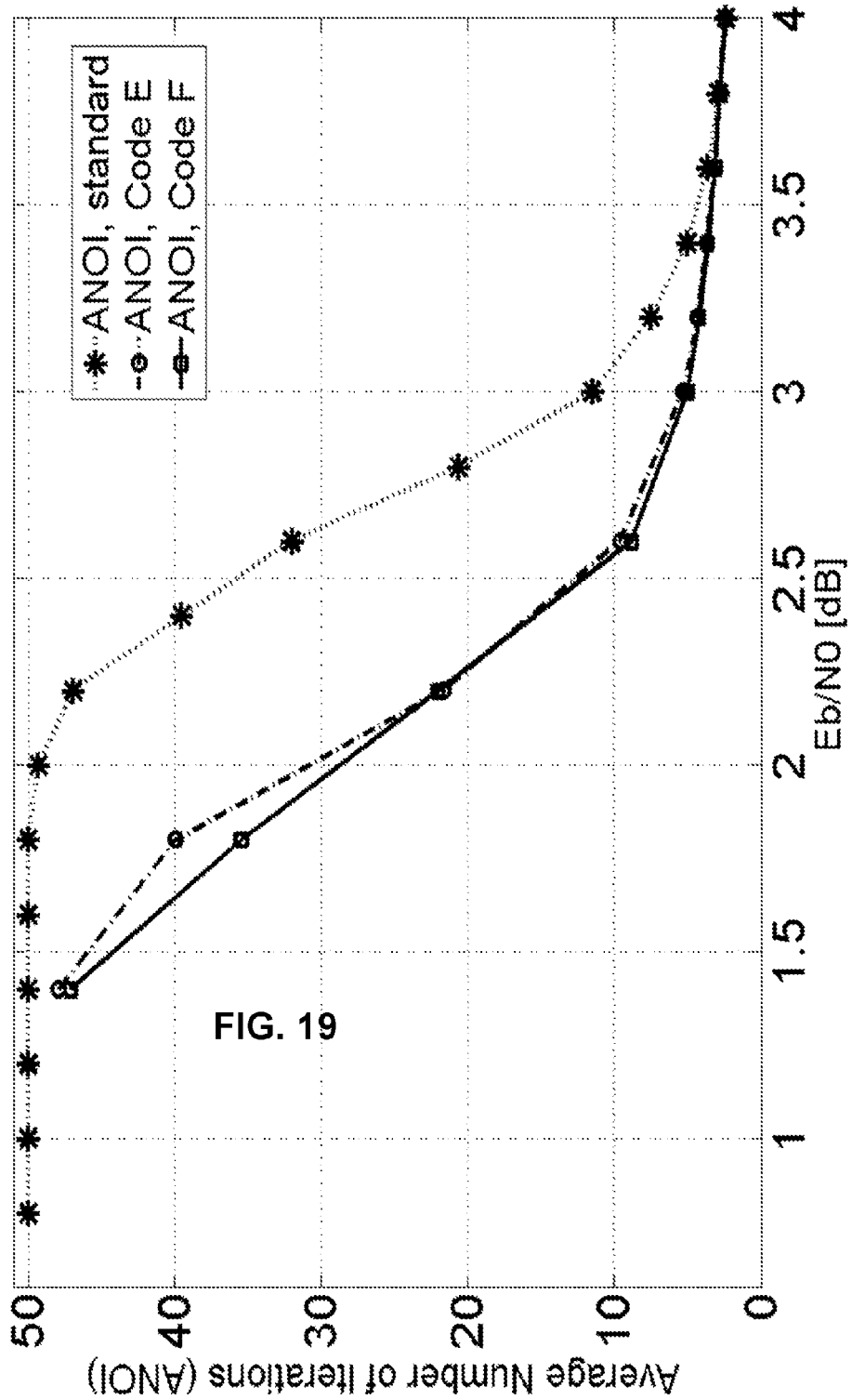
FIG. 19 is a diagram showing the Average Number of Iterations (ANOI) for various LDPC-CC codes for Frame size equal to 1152 and code rate 3/4.

FIG. 19 is a diagram showing the Average Number of Iterations (ANOI) for various LDPC-CC codes for Frame size equal to 1152. Frame size: 1152 bits; Rate: 3/4; Modulation format: BPSK. The code characteristics are similar to those in FIG. 18.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blue-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. In a device for generating a Variable Node Prototype Matrix for a semi-infinite transposed parity check matrix $H^T$, defined as Syndrome Former (SF), of an LDPC-convolutional code (LDPC-CC), a method of generating the Variable Node Prototype Matrix for the SF based on a set of predefined parameters including Rate (b/c), Memory ($m_s$) and Period (T) and a set of predefined constraints including Variable and Check Node Degree Distribution ($d_v$ and $d_c$), Girth and ACE ($n_{ACE}$, $d_{ACE}$), where ACE is Approximate Cycle Extrinsic Message Degree, b is the number of information bits per encoding time instance, and c is the number of code bits per encoding time instance and an integer no less than 2, the method comprising:
defining an empty Variable Node Prototype Matrix shell having T number of phases (t), each phase t comprising of c rows and (c−b)×($m_s$+1) columns;
generating c×c cells of each phase t, t∈{0, T−1};
defining a c×c permuted unit matrix corresponding to the generated c×c cells of each phase; and
randomly inserting the c×c permuted unit matrices in the positions of the c×c empty cells at each phase of the empty Variable Node Prototype Matrix shell until the set of the predefined parameters and the set of predefined constraints are satisfied, thereby generating the Variable Node Prototype Matrix for the SF.

2. The method of claim 1, where the Variable Node Prototype Matrix is comprised of binary connections.

3. The method of claim 2, further comprising replacing each binary connection with a non-binary connection to generate a non-binary Variable Node Prototype Matrix.

4. The method of claim 3, where the lower left (c−b)×(c−b) unit sub-matrix of the first c×c cells of each phase t is a unit matrix and the LDPC-CC is a systematic code.

5. A device for generating a Variable Node Prototype Matrix for a semi-infinite transposed parity check matrix $H^T$, defined as syndrome former (SF) of an LDPC-convolutional code (LDPC-CC), the device comprising:
means for receiving a set of predefined parameters including Rate (b/c), Memory ($m_s$) and Period (T), and a set of predefined constraints including Variable and Check Node Degree Distribution ($d_v$ and $d_c$), Girth and ACE ($n_{ACE}$, $d_{ACE}$) values, where ACE is Approximate Cycle Extrinsic Message Degree, b is the number of information bits per encoding time instance, and c is the number of code bits per encoding time instance and an integer no less than 2;
means for defining an empty Variable Node Prototype Matrix shell having T number of phases (t), each phase t comprising of c rows and (c−b)×($m_s$+1) columns;
means for generating c×c cells of each phase t, t∈{0, T−1};
means for defining a c×c permuted unit matrix corresponding to the generated c×c cells of each phase; and
means for outputting the Variable Node Prototype Matrix for the SF by randomly inserting the c×c permuted unit matrices in the positions of the c×c empty cells at each phase of the empty Variable Node Prototype Matrix shell until the received set of the predefined parameters and the received set of predefined constraints are satisfied, thereby generating the Variable Node Prototype Matrix for the SF.

6. A device for generating a Variable Node Prototype Matrix for a semi-infinite transposed parity check matrix $H^T$, defined as Syndrome Former (SF) of an LDPC-convolutional code (LDPC-CC) based on a set of predefined parameters including Rate (b/c), Memory ($m_s$) and Period (T) and a set of predefined constraints including Variable and Check Node Degree Distribution ($d_v$ and $d_c$), Girth and ACE ($n_{ACE}$, $d_{ACE}$), where ACE is Approximate Cycle Extrinsic Message Degree, b is the number of information bits per encoding time instance, and c is the number of code bits per encoding time instance and an integer no less than 2, the device comprising:
means for defining an empty Variable Node Prototype Matrix shell having T number of phases (t), each phase t comprising of c rows and (c−b)×($m_s$+1) columns;
means for generating c×c cells of each phase t, t∈{0, T−1};
means for defining a c×c permuted unit matrix corresponding to the generated c×c cells of each phase; and
means for randomly inserting the c×c permuted unit matrices in the positions of the c×c empty cells at each phase of the empty Variable Node Prototype Matrix shell until the set of the predefined parameters and the set of predefined constraints are satisfied, thereby generating the Variable Node Prototype Matrix for the SF.

7. A device for generating a Variable Node Prototype Matrix for a semi-infinite transposed parity check matrix $H^T$, defined as syndrome former (SF) of an LDPC-convolutional code (LDPC-CC), the comprising:
means for storing a set of predefined parameters including Rate (b/c), Memory ($m_s$) and Period (T) and a set of predefined constraints including Variable and Check Node Degree Distribution ($d_v$ and $d_c$), Girth and ACE ($n_{ACE}$, $d_{ACE}$), where ACE is Approximate Cycle Extrinsic Message Degree, b is the number of information bits per encoding time instance, and c is the number of code bits per encoding time instance and an integer no less than 2;
means for defining an empty Variable Node Prototype Matrix shell having T number of phases (t), each phase t comprising of c rows and (c−b)×($m_s$+1) columns;
means for generating c×c cells of each phase t, t∈{0, T−1};
means for defining a c×c permuted unit matrix corresponding to the generated c×c cells of each phase; and
means for randomly inserting the c×c permuted unit matrices in the positions of the c×c empty cells at each phase of the empty Variable Node Prototype Matrix shell until the set of the predefined parameters and the set of predefined constraints are satisfied to thereby generate the Variable Node Prototype Matrix for the SF.

8. The device of claim 7, further comprising means for multiplying a received codeword with the syndrome former to identify a valid codeword.

9. The device of claim 7, where the Variable Node Prototype Matrix is comprised of binary connections.

* * * * *